United States Patent [19]

Martin et al.

[11] 4,390,841
[45] Jun. 28, 1983

[54] MONITORING APPARATUS AND METHOD FOR BATTERY POWER SUPPLY

[75] Inventors: Harry L. Martin, Knoxville, Tenn.; Raymond E. Goodson, West Lafayette, Ind.

[73] Assignee: Purdue Research Foundation, West Lafayette, Ind.

[21] Appl. No.: 196,398

[22] Filed: Oct. 14, 1980

[51] Int. Cl.³ ............................................. G01N 27/46
[52] U.S. Cl. ...................................... 324/427; 429/93
[58] Field of Search ............................... 324/425–428, 324/433, 434; 364/483; 429/93

[56] References Cited

U.S. PATENT DOCUMENTS

| | | | |
|---|---|---|---|
| 3,532,968 | 10/1970 | Overlie | 324/433 |
| 3,971,980 | 7/1976 | Jungfer | 324/427 |
| 4,289,836 | 9/1981 | Lemelson | 429/93 |
| 4,295,097 | 10/1981 | Thompson | 324/426 |

Primary Examiner—Michael J. Tokar
Attorney, Agent, or Firm—John R. Nesbitt; Robert E. Harris

[57] ABSTRACT

A monitoring apparatus and method are disclosed for monitoring and/or indicating energy that a battery power source has then remaining and/or can deliver for utilization purposes as, for example, to an electric vehicle. A battery mathematical model forms the basis for monitoring with a capacity prediction determined from measurement of the discharge current rate and stored battery parameters. The predicted capacity is used to provide a state-of-charge indication. Self-calibration over the life of the battery power supply is enacted through use of a feedback voltage based upon the difference between predicted and measured voltages to correct the battery mathematical model. Through use of a microprocessor with central information storage of temperature, current and voltage, system behavior is monitored, and system flexibility is enhanced.

12 Claims, 3 Drawing Figures

MONITORING APPARATUS AND METHOD FOR BATTERY POWER SUPPLY

FIELD OF THE INVENTION

This invention relates to a monitoring apparatus and method and, more particularly, relates to an apparatus and method for monitoring and/or indicating the energy that a battery power source has then remaining and/or available for delivery.

BACKGROUND OF THE INVENTION

It is often necessary and/or desirable to accurately itermine the state-of-charge of a power supply such as a battery or battery pack. Heretofore, the most common methods for indicating state-of-charge have been through the use of ampere-hour meters, specific gravity measurements, or voltage analyzers.

Of these, ampere-hour meters simply integrate the discharge current and cannot compensate for changes in battery capacity as a function of current discharge history. Specific gravity measurements, on the other hand, are normally made with a hydrometer and must be applied to each cell to achieve accurate measurement. Since specific gravity also lags the available capacity, results gained through use of a hydrometer can be somewhat inaccurate and since the expense of monitoring each cell is large, determination of state-of-charge by specific gravity is seldom used for continuous indications (as opposed to use at the start of a cycle to determine the initial state-of-charge). Voltage analyzers measure the terminal voltage and determine state-of-charge in various manners. With respect to such analyzers, polarization effects (caused by charging or fast discharging) can adversely change the indication of the analyzer meters, and most such analyzers tend to be only uni-directional (work accurately on discharge only) with no provision for aging effects.

A number of patents have been issued which describe various devices and/or methods for predicting the state-of-charge of batteries (particularly lead-acid batteries) for vehicle applications. Among such patents are U.S. Pat. Nos. 3,778,702; 3,895,284; 3,971,980; 3,997,888; 4,012,681; 4,017,724; 4,024,523; 4,025,916; 4,051,424; 4,052,717; 4,080,560; 4,114,083; and 4,153,867.

Monitoring and/or indicating devices heretofore known and/or utilized, while describing various state-of-charge meters and/or methods, have not proved to be completely satisfactory and have limitations which can be eliminated, or at least minimized, by new realizations and concepts in this field.

SUMMARY OF THE INVENTION

This invention provides a novel apparatus and method for monitoring and/or indicating the energy that a battery power source has then remaining and/or available for delivery. Self-calibration is also provided over the life of the battery power source, and system flexibility and behavior monitoring are enhanced through use of a microprocessor.

It is therefore an object of this invention to provide a novel apparatus and method for monitoring and/or indicating the energy that a battery power source has then remaining and/or available for delivery.

It is another object of this invention to provide a novel apparatus and method for monitoring and/or indicating the state-of-charge of a battery power source.

It is another object of this invention to provide a novel apparatus and method for monitoring the then remaining available energy that a battery power source can deliver for utilization purposes.

It is still another object of this invention to provide a novel apparatus and method for a monitor that is self-calibrating.

It is still another object of this invention to provide a novel apparatus and method for monitoring and/or indicating the energy that a battery power source has then remaining and/or available that has enhanced flexibility and behavior monitoring.

With these and other objects in view, which will become apparent to one skilled in the art as the description proceeds, this invention resides in the novel method, construction, combination, and arrangement of parts substantially as hereinafter described, and more particularly defined by the appended claims, it being understood that such changes in the precise embodiment of the herein disclosed invention are meant to be included as come within the scope of the claims.

BRIEF DESCRIPTION OF THE DRAWINGS

The accompanying drawings illustrate a complete embodiment of the invention according to the best mode so far devised for the practical application of the principles thereof, and in which.

DESCRIPTION OF THE INVENTION

Figure 1:
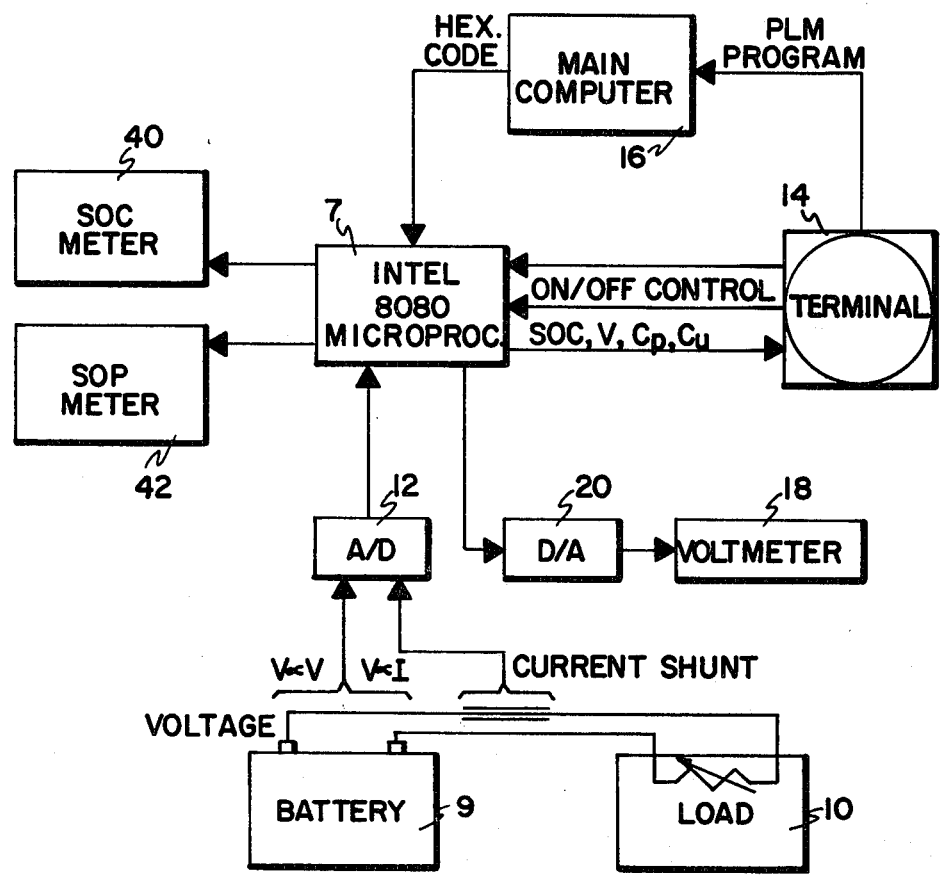
FIG. 1 is a block diagram of hardware implementation of apparatus utilized for monitoring a battery power supply and providing indications with respect thereto.

The monitor of this invention is well suited to monitor and/or indicate the energy that a power source such as a battery pack has then remaining and/or can deliver for utilization purposes, such as, for example, to an electric vehicle. Such information can be necessary, for example, to enable an operator to make judgments concerning remaining vehicle range.

Another attribute of the apparatus and method of this invention is the ability to indicate deviations of the battery system from standard operation. Such information may be used, for example, to determine necessary maintenance and thus protect investment in batteries.

In addition, the monitor of this invention can be programmed to control the cutoff of charging and to indicate the use of reserve capacity (less than 10% state-of-charge), to provide a meter that is bi-directional (operates correctly during charge and discharge), and to provide a monitor that can be used equally well in both electric-hybrid and total electric vehicle applications.

The monitor of this invention is also self-calibrating due to the use of a voltage feedback correction internal to the system. Such self-calibration allows the system to accurately correct for aging and charging effects over the life of the battery as it is being used, and also allows for detection of other battery parameters such as battery failure and out-of-specification performance.

Most advanced state-of-charge meters integrate current to obtain the total charge available to be delivered by the battery. This total charge is fixed for any battery if the discharge current is low and the temperature is controlled. The total charge available to be delivered thus depends on the amount of active material able to be chemically reacted. Under highly variable discharge conditions and high current rates, batteries are unable to deliver this total charge because portions of the active material become unavailable for reaction, temperature affects the reaction rates, and diffusion rates are not sufficient to bring electrolyte into proximity with the active material. These conditions are common in electric vehicle applications.

For example, with electric vehicles, the range (and thus the state-of-charge of the battery) varies according to how the vehicle is used. This means that the energy available from the battery depends upon how the vehicle has been used. The voltage from the battery also varies over rather wide limits under dynamic use.

The present invention provides a generic way to solve these problems in battery monitoring. While previous apparatus and methods have attempted to use the voltage, current, and temperature measurements to compute the state-of-charge of the battery, none of the known apparatus and/or methods have combined the three parameters mathematically to develop a self-calibrating state-of-charge indicator. In this invention, a mathematical predictive model of the battery performance is utilized, which model is initially calibrated to the particular battery type for which it is intended to be used.

As shown in FIG. 1, the predictive model receives, as an input, the actual current (I) being drawn from the battery and computes a state-of-charge based on the integrated current, the instanteous current, and the model output. The voltage (V) is also computed and compared with the voltage actually measured at the battery terminals. A voltage feedback (based upon difference between computed and measured voltages) allows both a check on battery performance in the short term and is used for recalibration over the longer term. This parallel computation of performance of a battery is felt to be unique in predicting battery state-of-charge.

The mathematical model illustrated herein to predict performance characterizes the diffusion limitations in lead-acid batteries. For other batteries, other physical phenomena, such as internal resistance changes or active material reconfiguration, would govern battery performance. Such models require knowledge or test of the particular batteries for which the meter would be used. Thus, such a model is well suited for mass produced vehicles or vehicles where the meters could be calibrated initially to the particular battery being monitored.

In realization of the monitor of this invention, a microprocessor is preferably utilized, as shown in FIG. 1. In a working model, an INTEL 8080 microprocessor 7 with two channels of data collection and a terminal available for direct interfacing were utilized (the terminal for interfacing can be eliminated, if desired, however, where individual initialization is not required). The two data channels collect current and voltage signals at one second intervals from a battery power supply 9 connected with a load 10 (which could be, for example, an electric vehicle drive). As shown in FIG. 1, these signals are coupled to microprocessor 7 through analog to digital converter 12.

As also indicated in FIG. 1, microprocessor 7 is connected with at least one terminal 14 and preferably with computer 16 for storage of information as to voltage, current and temperature for the mathematical model. A voltmeter direct output reading is provided by voltmeter 18 connected with microprocessor 7 through digital to analog converter 20. Received information is processed by microprocessor 7 to determine the state-of-charge and develop the desired condition signals, such as end-of-charge, out-of-specification, and reserve capacity usage.

Figure 2:
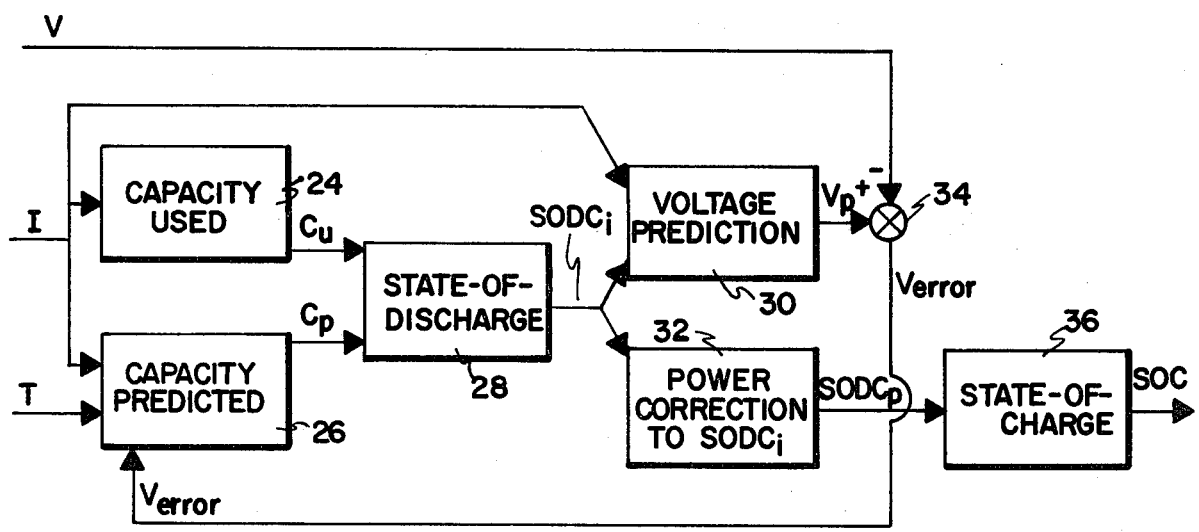
FIG. 2 is a block diagram of the monitor of this invention illustrating operation.
Figure 3:
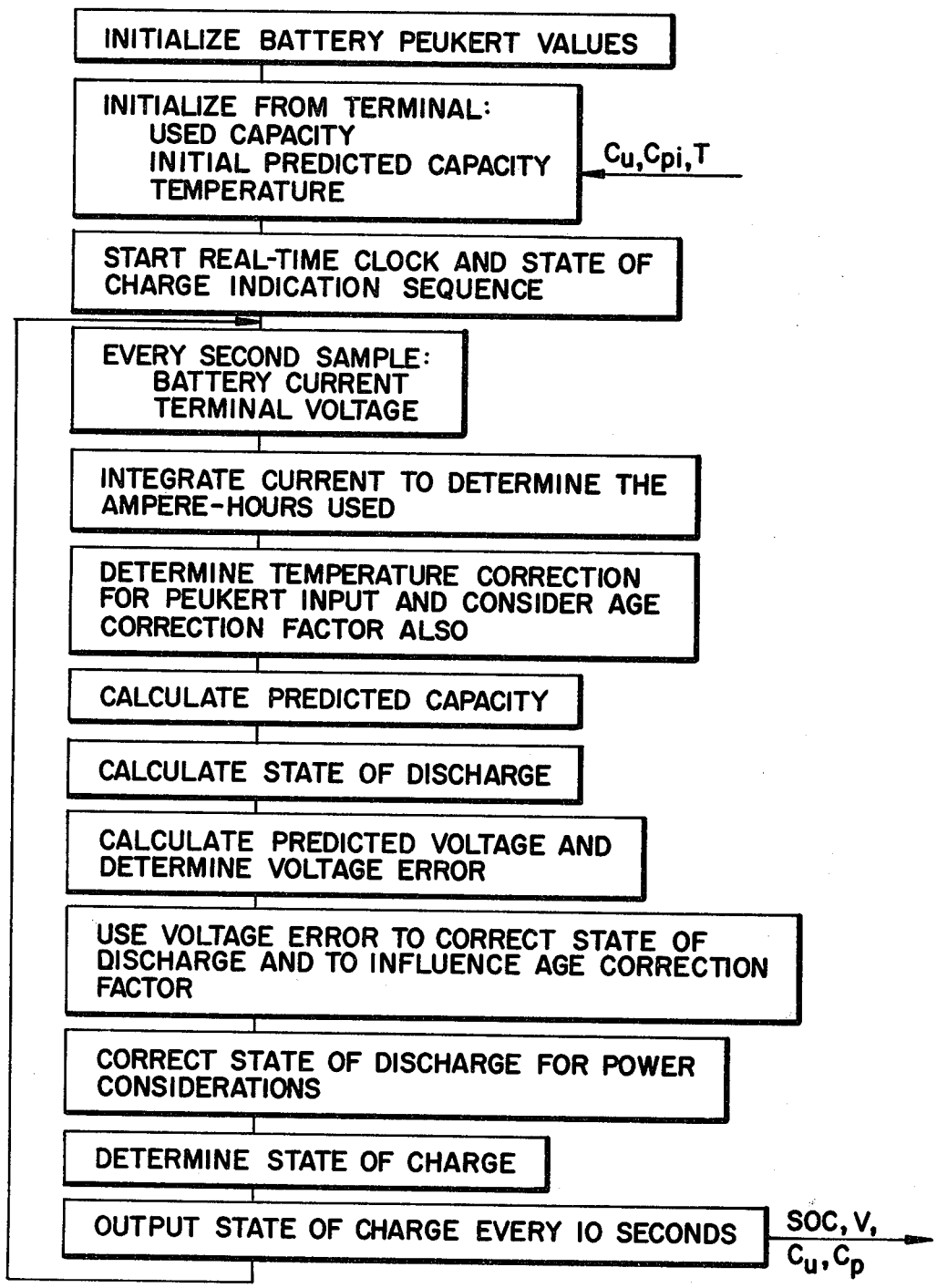
FIG. 3 is a flow diagram for a microprocessor program utilized in operation.

FIG. 2 is a block diagram of system logic, and FIG. 3 is a flow chart of the computer program utilized in conjunction therewith. It should be realized, however, that the system shown is for illustrative purposes only, and the invention is not meant to be restricted thereto, it being realized that modifications would be appropriate for operation of the system in other applications, including remote applications.

After the system is initialized by entering the ambient temperature, used capacity, and initial capacity, the microprocessor samples the current and voltage simultaneously at one second intervals. As shown in FIG. 2, the current signal (I) is integrated to determine the used capacity (designated by block 24), and the current signal (I) is also utilized in an original capacity prediction function (designated by block 26) which approximates the battery as a first-order, mass transfer limited system. The predicted capacity ($C_p$) and used capacity ($C_u$) are utilized to determine state-of-discharge (designated by block 28) with a state-of-discharge signal ($SODC_i$) being utilized along with the current signal (I) for voltage prediction (designated by the block 30) and for power correction of state-of-discharge (designated by the block 32).

The voltage prediction signal ($V_p$) is utilized along with the voltage signal (V) at summing element 34 to determine a voltage error signal ($V_{error}$) which is the difference between the voltages, and the $V_{error}$ signal is fed back for utilization in the mathematical model for the capacity predicted function.

The power corrected state-of-discharge output signal ($SODC_p$) is developed from a mathematical model and the state-of-discharge to account for the non-linear voltage drop that occurs during the discharge cycle. This correction is needed because the remaining energy, not ampere hours, determines the vehicle range. This signal ($SODC_p$) is utilized to determine the state-of-charge (SOC) (designated by block 36). As shown in FIG. 1, the state-of-charge (SOC) can be displayed on SOC meter 40 (preferably located for viewing by an operator).

Recharging and regenerative braking are accounted for by assuming an 85% Coulombic efficiency. When the state-of-discharge reaches zero, the battery is fully charged (15% over-charge is specified by most manufacturers). A signal can be outputted by the microprocessor at this level to control the charger cutoff, if desired. Out-of-specification signals are also available if the predicted and measured voltages differ by more than 0.2 volts per 6 volt unit. This signal indicates that the battery is in need of maintenance.

A state-of-power (SOP) meter 42 can also be provided utilizing microprocessor 7. The needed information from the battery (i.e., current and voltage signals) is available in the signal sample for the state-of-charge meter, and thus, state-of-power can easily be implemented from microprocessor 7. Two methods for providing state-of-power indications have been developed. One relates the present open circuit voltage to the initial open circuit voltage, while the other relates the controller duty cycle to full power to determine the percentage of total power available which is being used at any instant.

Typical voltage versus time curves have been normalized to yield voltage versus state-of-discharge for a given current, and these equations, which are shown in Table 1, form the basis of the voltage prediction function. The predicted voltage is compared to the measured voltage and the difference is used to correct the meter reading. This correction serves the purpose of self-calibration and can be used to determine the condition of the system as compared to an ideal battery. The voltage error is implemented by short and long term considerations and actually conforms to the battery behavior over a number of cycles.

TABLE 1

| Equation Number | Equation |
|---|---|
| 1 | $C_u = \int Idt$ for $I > 0$; $C_u = \int 0.85 \cdot Idt$ for $I < 0$ |
| 2 | $a = f(T, V_{Error})$ |
| 3 | $C_p + \tau \dfrac{dC_p}{dt} = a^* \dfrac{K}{I^{(N-1)}} - (100^*V_{Error})$ for $I > I_5$ |
|  | $C_p + \tau \dfrac{dC_p}{dt} = a^* \dfrac{K}{I_5^{(N-1)}} - (100^*V_{Error})$ for $I < I_5$ |
| 4 | $SODC_i = \dfrac{C_u}{C_p} * 100$ |
| 5 | $V_p = 6.40 - (SODC_i{}^*V_c + I^*R_b)$ for $SODC_i < 50$ |
|  | $V_p = 6.40 - (SODC_i{}^*V_c + I^*R_b) - ((SODC_i - 50)^2/C_1 + (SODC_i - 50)/C_2)$ for $50 \leq SODC_i \leq 90$ |
| 6 | $SODC_p = SODC_i * \left( \dfrac{6.25 - SODC_i/200}{5.75} \right)$ |
| 7 | $SOC = 100 - SODC_p$ |

| Variable | | Units |
|---|---|---|
| V | Measured Battery Voltage | v |
| I | Battery Current | A |
| T | Ambient Operating Temperature | °F. |
| $C_u$ | Used Capacity | A·h |
| $C_p$ | Predicted Capacity | A·h |
| $I_5$ | Five-Hour Discharge Current For Battery | A |
| a | Peukert Correction Coefficient | % |
| K,N | Peukert Battery Characteristic Values | |
| $\tau$ | Battery Mass Transfer Time Constant | min ($\doteq$3) |
| $SODC_i$ | Ampere-Hour Based State-of-Discharge | % |
| $SODC_p$ | Energy Corrected State-of-Discharge | % |
| $V_p$ | Predicted Battery Voltage | v |
| $V_c$ | Voltage Change Due To Electrolyte Conc. Change | v/% |
| $V_{Error}$ | Difference Between Predicted and Measured Voltages | v |
| $R_b$ | Battery Internal Resistance | |
| $C_1$ | Polarization Coefficient | %/v |
| $C_2$ | Polarization Coefficient | %/v |
| SOC | State-of-Charge | % |
| SOP | State-of-Power | % |

Additional information can also be obtained from the monitor if desired. The remaining range in miles of the vehicle could be displayed, for example, if a velocity signal is sampled, and/or the approximate time to discharge at present discharge rates could also be determined and displayed.

The system as described can be implemented by using a program, the flow chart for which is shown in FIG. 3, with the program performing with hardware as shown in FIG. 1. The concept of storing the performance of the battery in a microprocessor and relying on the measurements of voltage, current and temperature to predict completely state-of-charge is independent of the battery type or configuration being used. The concept will work, then, for lead-acid, zinc-oxide-nickel, zinc-chlorine, zinc-bromine and other types of batteries. The concept is universal because all batteries behave such that voltage, current and temperature are the primary state variables underlying the electro-chemical phenomena being considered. When so utilized, the hardware would not change and only the software which was used to code the mathematical model into the memory of the microprocessor would change.

As can be appreciated from the foregoing, this invention provides an apparatus and method that has advantages over heretofore known and/or used apparatus and methods. Such advantages are achieved by:

1. The use of a mathematical model which forms the basis of the indicator (first-order diffusion based capacity prediction determined from discharge current rate and stored power parameters);

2. The ability of the indicator to self-calibrate its battery model over the life of the battery by the continuous feedback information obtained from the measurements made (current predicts capacity, the model predicts voltage and compares this voltage to actual battery voltage to provide a calibration signal for battery model parameters);

3. The use of the microprocessor central information storage with temperature, current, and voltage signals to monitor system behavior (this allows application to different battery types by only replacing the battery characteristics in the processor memory);

4. The use of a microprocessor base allows flexibility in control signals to the charger and instrument panel which is not possible with analog devices (charge control, low state-of-charge warnings, and battery system malfunctions are but a few of the possible signals which the microprocessor can generate);

5. A provision for continuous bi-directional operation (charging and discharging); and 6. The use of two indicators, or monitors viewable by the operator, i.e., a state-of-charge meter (indicative of the energy remaining in the battery until end of discharge) and a state-of-power meter (indicative of the power the battery can deliver in its condition at any time) indicative of a battery used in a vehicle under dynamic operation.

This invention thus provides a novel apparatus and method for monitoring a battery power supply and indicating the energy then remaining and/or deliverable.

What is claimed is:

1. A monitoring device for a battery power supply, said device comprising:
   input means adapted to receive a current signal from a battery power supply to be monitored;
   first capacity means connected with said input means to receive said current signal therefrom and responsive thereto providing an output signal indicative of the used capacity of a said battery power supply then being monitored;
   second capacity means connected with said input means to receive said current signal therefrom, said second capacity means providing predicted parameters dependent upon the diffusion characteristics of said battery power supply, and said second capacity means being responsive to said current signal and to said predicted parameters of said battery power supply to provide an output signal indicative of the predicted remaining capacity of a said battery power supply then being monitored; and determining means connected with first and second capacity means to receive said outputs therefrom and responsive thereto providing an output signal indicative of the state-of-charge of said battery power supply then being monitored.

2. The device of claim 1 wherein said device includes second input means adapted to receive a voltage signal from said battery supply then being monitored, voltage prediction means connected with said determining means for providing a predicted voltage, and comparison means connected with said second input means and said voltage prediction means for providing an error signal indicative of the voltage error therebetween, said error signal being coupled to said second capacity means.

3. The device of claim 1 wherein said determining means includes a means for determining the state-of-discharge of said battery power supply being monitored.

4. The device of claim 3 wherein said determining means includes power correction means for correcting the signal produced indicative of state-of-discharge.

5. The device of claim 3 wherein said determining means includes means for determining the state-of-charge of said battery power supply being monitored from said state-of-discharge signal.

6. A device of claim 1 wherein said second capacity means is a mathematical predictive model.

7. The device of claim 1 wherein said device includes a microprocessor for determining used and predicted capacities and to determine said state-of-charge of said battery power supply.

8. The device of claim 1 wherein said device includes a state-of-charge meter for indicating said state-of-charge determined by said determining means.

9. The device of claim 1 wherein said device includes a state-of-power meter for indicating power deliverable by said battery power supply.

10. A monitoring device for a battery power supply, said device comprising:

input means adapted to receive a current signal from a battery power supply being monitored;

means connected with said input means for determining the used capacity of said battery power supply being monitored and providing an output indicative thereof;

means for establishing a battery predictive model of said battery power supply being monitored, said model providing an output indicative of the predicted capacity of said battery power supply being monitored with said predicted capacity being dependent upon the diffusion characteristics of said battery power supply;

means connected with said used capacity determining means and said battery predictive model for determining the state-of-charge of said battery power supply being monitored; and means connected with said state-of-discharge determining means for determining therefrom the state-of-charge of said battery power supply monitored.

11. The device of claim 10 wherein said device includes means connected with said input means at said state-of-discharge determining means for predicting a voltage for said battery power supply being monitored, wherein said device includes second input means adapted to receive a voltage signal from said battery power supply being monitored, and wherein said device includes voltage comparison means connected with said second input means and said voltage prediction means for comparing the voltages received therefrom and providing an error output signal indicative of deviations therebetween, said error output signal being coupled to said battery predictive model means for calibration purposes.

12. A monitoring device for a battery power supply, said device comprising:

first input means adapted to receive a current signal from a battery power supply to be monitored;

means establishing a mathematical model of said battery power supply, said model being connected with said first input means to receive said current signal providing an output indicative of the predicted capacity of said battery power supply being monitored;

used capacity detecting means connected with said input means to receive said current input signal and providing an output signal indicative of the used capacity of said battery being monitored;

state-of-discharge determining means connected with said mathematical model and said used capacity determining means to receive said outputs therefrom and responsive thereto providing a signal indicative of the state-of-discharge of said battery power supply being monitored;

power correction means connected with said state-of-discharge means to receive said output signal therefrom;

state-of-charge means connected with said power correction means to provide an output signal indicative of the state-of-charge of said battery power supply being monitored;

second input means adapted to receive a voltage signal from said battery power supply being monitored;

voltage prediction means connected with said state-of-discharge determining means and providing a predicted voltage for said battery power supply being monitored; and voltage comparison means connected with said second input means and said voltage prediction means and providing a voltage error signal that is coupled to said mathematical model for calibration purposes.

* * * * *

UNITED STATES PATENT AND TRADEMARK OFFICE
CERTIFICATE OF CORRECTION

PATENT NO. : 4,390,841

DATED : June 28, 1983

INVENTOR(S) : Harry L. Martin et al.

It is certified that error appears in the above-identified patent and that said Letters Patent is hereby corrected as shown below:

In column 1, after the title "Monitoring Apparatus and Method for Battery Power Supply" and before "Field of the Invention" insert as a separate paragraph:

--The U.S. Government has rights in this invention as provided for by the terms of Contract No. DE-AC02-79ER10044 awarded by the Department of Energy.--

Signed and Sealed this

Seventh Day of January 1986

[SEAL]

Attest:

DONALD J. QUIGG

Attesting Officer

Commissioner of Patents and Trademarks